(12) United States Patent  
Strzalkowski

(10) Patent No.: US 8,866,513 B2
(45) Date of Patent: Oct. 21, 2014

(54) CIRCUIT ARRANGEMENT AND METHOD FOR GENERATING A DRIVE SIGNAL FOR A TRANSISTOR

(75) Inventor: Bernhard Strzalkowski, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/603,063

(22) Filed: Sep. 4, 2012

(65) Prior Publication Data

US 2012/0326757 A1 Dec. 27, 2012

Related U.S. Application Data

(62) Division of application No. 12/642,486, filed on Dec. 18, 2009, now Pat. No. 8,258,820.

(30) Foreign Application Priority Data

Dec. 19, 2008 (DE) .......................... 10 2008 055 051

(51) Int. Cl.
*H03K 3/00* (2006.01)
(52) U.S. Cl.
USPC .......................................... 327/108; 327/112
(58) Field of Classification Search
USPC ................................................ 327/108–112
See application file for complete search history.

(56) References Cited

U.S. PATENT DOCUMENTS

| | | | |
|---|---|---|---|
| 4,766,921 A | 8/1988 | Williams | |
| 4,866,556 A | 9/1989 | Hebenstreit | |
| 5,134,311 A | 7/1992 | Biber et al. | |
| 5,410,262 A | 4/1995 | Kang | |
| 5,583,460 A | 12/1996 | Dohi et al. | |
| 5,761,020 A | 6/1998 | Nadd | |
| 5,773,999 A | 6/1998 | Park et al. | |
| 5,955,792 A | 9/1999 | Fischer et al. | |
| 6,320,407 B1 | 11/2001 | Sakamoto | |
| 6,356,138 B1 | 3/2002 | Ohshima | |
| 6,674,274 B2 | 1/2004 | Hobrecht et al. | |
| 6,768,363 B2 | 7/2004 | Yoo et al. | |
| 6,873,191 B2 | 3/2005 | Dequina et al. | |
| 7,433,171 B2 | 10/2008 | Vincent et al. | |
| 7,839,200 B2 | 11/2010 | Im et al. | |
| 8,258,820 B2 * | 9/2012 | Strzalkowski | 327/108 |

FOREIGN PATENT DOCUMENTS

GB 2417625 3/2006
WO 2006039823 4/2006

OTHER PUBLICATIONS

Non-Final Office Action mailed Apr. 1, 2011 in U.S. Appl. No. 12/642,486.
Final Office Action mailed Dec. 22, 2011 in U.S. Appl. No. 12/642,486.

* cited by examiner

*Primary Examiner* — Kenneth B. Wells
(74) *Attorney, Agent, or Firm* — Shumaker & Sieffert, P.A.

(57) ABSTRACT

Disclosed is a circuit arrangement for generating a drive signal for a transistor. In one embodiment, the circuit arrangement includes a control circuit that receives a switching signal, a driver circuit that outputs a drive signal, and at least one transmission channel. The control circuit transmits, depending on the switching signal for each switching operation of the transistor, switching information and switching parameter information via the transmission channel to the driver circuit. The driver circuit generates the drive signal depending on the switching information and depending on the switching parameter information.

21 Claims, 8 Drawing Sheets

CIRCUIT ARRANGEMENT AND METHOD FOR GENERATING A DRIVE SIGNAL FOR A TRANSISTOR

CROSS REFERENCE TO RELATED APPLICATIONS

This Utility Patent Application is a Divisional Application of U.S. Pat. No. 8,258,820, filed Dec. 18, 2009, which claims priority to German Patent Application No. DE 10 2008 055 051.5, filed on Dec. 19, 2008, and incorporated herein by reference.

TECHNICAL FIELD

The present disclosure relates to a circuit arrangement and a method for generating a drive signal for a transistor, in one embodiment a MOS transistor.

BACKGROUND

MOS transistors, such as IGBTs or MOSFETs, for example, can be used as electronic switches for switching electrical loads. During switching operations, that is to say during switching on and switching off of the transistor, voltage and current changes occur at the load, in current supply lines to the transistor and the load, in a connecting line between the transistor and the load, and also in the transistor itself. In this case, the speed or gradient with which these voltage and current changes occur is dependent on the switching speed of the transistor, that is to say dependent on how rapidly the transistor switches on or off.

The voltage and current changes which occur during the switching of a transistor can lead to electromagnetic interference pulses. The amplitude of the interference pulses is dependent firstly on the switching speed of the transistor and secondly on the interconnection of the transistor with the load, and here in one embodiment on the type and length of the lines. There is a need to reduce the interference pulses which occur during the switching of a transistor.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Various embodiments are explained below with reference to figures. The figures serve for elucidating the basic principle, and so only the parts or component zones required for understanding this basic principle are illustrated. In the figures, unless indicated otherwise, identical reference symbols designate identical parts with the same meaning

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various embodiments described herein may be combined with each other, unless specifically noted otherwise.

One embodiment provides a circuit arrangement for generating a drive signal for a transistor. The circuit arrangement includes: a control circuit having an input for receiving a switching signal and having at least one output; a driver circuit having at least one input and having an output for providing the drive signal; at least one transmission channel, connected between the at least one output of the control circuit and the at least one input of the driver circuit. The control circuit of this circuit arrangement is configured to transmit, depending on the switching signal for each switching operation of the transistor, switching information and switching parameter information via the transmission channel to the driver circuit; and the driver circuit is configured to generate the drive signal depending on the switching information and depending on the switching parameter information.

One embodiment provides a method for generating a drive signal for a transistor. The method includes, for each switching operation of the transistor: providing switching information and switching parameter information; generating a first signal level of the drive signal after providing the switching information, and generating a second signal level of the drive signal, the second signal level being dependent on the switching parameter information, after providing the switching parameter information.

Figure 1:
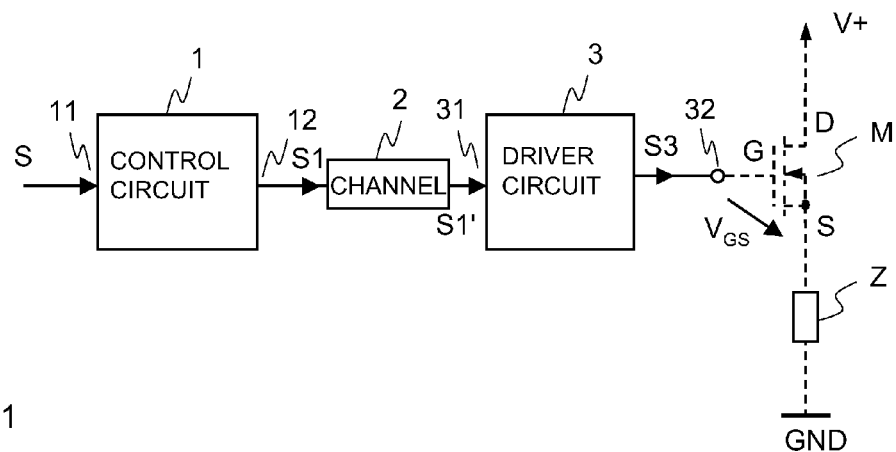
FIG. 1 illustrates one embodiment of a circuit arrangement for generating a drive signal for a transistor, the arrangement including a control circuit, a transmission channel and a driver circuit.

FIG. 1 illustrates, on the basis of a block diagram, one embodiment of a circuit arrangement for generating a drive signal S3 for a transistor M. This circuit arrangement includes a control circuit 1, a driver circuit 3, and also a transmission channel 2 arranged between the control circuit 1 and the driver circuit 3. The control circuit 1 has an input 11 for receiving a switching signal S, and at least one output 12 coupled to a transmitter-side end of the transmission channel 2. The driver circuit 3 has at least one input 31 coupled to a receiver-side end of the transmission channel 2, and an output 32 for providing a drive signal S3 for the transistor M.

In order to afford a better understanding, a transistor M is likewise illustrated in FIG. 1. In the example illustrated, the transistor is a MOS transistor, specifically an n-channel MOSFET. It should be pointed out that the use of an n-channel MOSFET should be understood merely as an example. The circuit arrangement illustrated is suitable for driving any MOS transistors, that is to say also for driving IGBTs, or also for driving bipolar transistors.

The transistor M driven by the circuit arrangement serves for example for switching a load Z connected in series with a load path of the transistor M between terminals for a positive supply potential V+ and a negative supply potential or reference potential GND. The drive signal S3 is fed to a control terminal of the transistor M. In the case of the MOSFET illustrated in the example, its drain-source path D-S forms its load path, and its gate terminal G forms the control terminal.

In the case of this circuit arrangement, the transmission channel 2 serves for transmitting control information from the control circuit 1 to the driver circuit 3. The transmission channel 2 can have a potential barrier, which will be explained below. Such a potential barrier is expedient when the switching signal S fed to the control circuit 1 and the drive signal S3 generated by the driver circuit 3 are referred to different reference potentials. This is the case for example when the transistor M to be driven by the circuit arrangement is a MOS transistor connected up as a high-side switch. As is known, a MOS transistor is a voltage-controlled component and turns on or turns off depending on a voltage between its gate terminal G and its source terminal. The reference potential to which a drive signal S3 fed to the transistor is referred, in the case of such a high-side transistor, is the source potential thereof. The source potential varies depending on the switching state of the transistor and can lie in the range of the upper supply potential V+ when the transistor is turned on, and in the range of the negative supply potential or reference potential GND when the transistor is turned off. By contrast, the switching signal S fed to the control circuit 1 can be referred to a constant potential, such as reference potential GND, for example.

Figure 2:
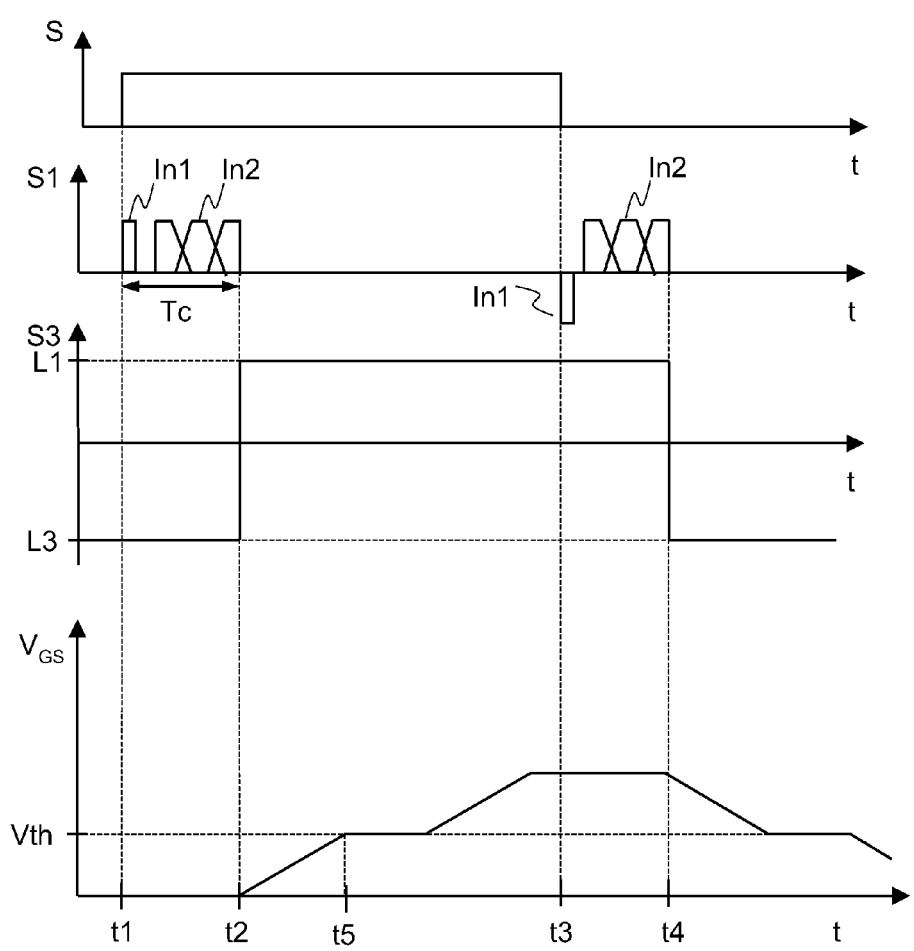
FIG. 2 illustrates an operating principle of one embodiment of the circuit arrangement on the basis of signal timing diagrams.

The switching signal S determines the desired switching state of the transistor M, that is to say contains information about whether the transistor M is to be driven in the on state or whether the transistor M is to be driven in the off-state. The switching signal S may contain, in one embodiment, information about the instants at which the transistor is intended to be driven in the on-state or driven in the off-state. The switching signal S can be any signal suitable for supplying such switch-on information and switch-off information to the control circuit 1. Referring to FIG. 2, the switching signal S is a two-valued signal, for example, which can assume a switch-on level and a switch-off level, where the transistor M is respectively to be switched on when the switching signal S assumes a switch-on level, and is intended to be switched off when the switching signal S assumes a switch-off level. It should be assumed for the further explanation that the switch-on level of the switching signal S is a high level and the switch-off level of the switching signal S is a low level. These signal levels can also be correspondingly interchanged. In the case of such a two-valued switching signal, the switching information for the transistor M is contained in level changes of this signal, where the transistor M is intended to be switched on when a level change of the switching signal S from the switch-off level to the switch-on level is present, and where the transistor M is intended to be switched off when a level change from the switch-on level to the switch-off level of the switching signal S is present. The use of a two-valued signal as switching signal S should be understood merely as an example. Any desired signal which is suitable for transmitting switch-on and switch-off information for the transistor M is suitable.

The operating principle of the circuit arrangement illustrated in FIG. 1 is explained in more detail below on the basis of timing diagrams illustrated in FIG. 2. FIG. 2 illustrates a timing diagram of the switching signal S, a timing diagram of an information signal S1 transmitted from the control circuit 1 to the driver circuit 3 via the channel 2, of a drive signal S3 generated by the driver circuit 3, and also the timing diagram of a drive voltage VGS of the transistor M that results from the drive signal S3. In the embodiment illustrated, the drive signal S3 is a drive current that charges or discharges a gate-source capacitance (not illustrated) of the transistor M.

In the embodiment illustrated in FIG. 2, a switch-on information in the form of a rising edge of the switching signal S is present at the instant t1. The control circuit 1 is configured to detect this switch-on information contained in the switching signal S and to transmit corresponding switching information In1 to the driver circuit 3 via the transmission channel 2. For explanation purposes, it should be assumed that the switching information representing a desired switch-on of the transistor M is a positive signal pulse of the information signal S1. The control circuit 1 is additionally adapted to transmit, in addition to the switching information, switching parameter information In2 to the driver circuit 3 via the transmission channel 2. Such switching parameter information In2 may be transmitted by the control circuit 1 for each switching operation of the transistor M.

The switching parameter information In2 contains information regarding the course of the switching operation. The switching parameter information In2 can contain switching speed information, for example, which indicates the speed at which the transistor M is intended to change its switching state, and which thus influences the gradient of the switching edges. The switching parameter information In2 may also contain information about what maximum amplitude a drive voltage of the transistor is intended to achieve. The switching parameter information In2 can also contain delay information which defines a waiting time between the presence of the switching information and the beginning of the switching operation, for example.

As one of the switching parameters which are influenced by the switching parameter information In2, the switching speed, in one embodiment, shall be considered below. The switching speed of a MOS transistor is directly dependent on the amplitude of a drive current, that is to say, during switch-on, on the amplitude of a charging current flowing into the gate-source capacitance and, during switch-off, on a discharging current flowing from the gate-source capacitance. In this case, the switching parameter information In2 contains information about the desired amplitude of the drive signal or drive current S3. The switching parameter information In2 and the switching information In1 can be transmitted in any temporal sequence—defined and known to the driver circuit—to the driver circuit.

As illustrated in FIG. 2, the switching parameter information In2 can be transmitted in one embodiment temporally after the switching information In1. In a departure from this, there is also the possibility of transmitting the switching parameter information In2 temporally before the switching information In1 or transmitting the switching information embedded into the switching parameter information In2, that is to say temporally between two sequences of the switching parameter information In2. As will be explained below there is also the possibility of transmitting the switching information In1 and the switching speed information In2 simultaneously via two parallel transmission channels to the driver circuit 3.

The switching information In1 and the switching parameter information In2 form control information that is transmitted from the control circuit to the driver circuit 3. A time duration during which these items of control information In1, In2 are transmitted is designated by Tc in the figures.

In FIG. 1, S1' denotes an information signal available at the receiver-side end of the transmission channel 2. In the case of disturbance-free transmission, this information signal S1' available at the receiver-side end corresponds to the transmitted information signal S1, and thus contains the switching information In1 and the switching parameter information In2. Owing to signal propagation times in the transmission channel 2, the information signal S1' fed to the driver circuit 3 can be temporally delayed relative to the information signal S1 transmitted by the control circuit. In order to simplify the illustration, such temporal delays during the transmission via the transmission channel 2 and owing to signal propagation times within the control circuit 1 and the driver circuit 3 are not taken into account in the figures.

The driver circuit 3 is designed to generate the drive signal S3 in a manner dependent on the switching information In1 and in a manner dependent on the switching parameter information In2. In the example illustrated, wherein the drive signal S3 is a charging current or discharging current for the gate-source capacitance of the transistor M, the switching information In1 determines the sign of the drive signal S3 and the switching parameter information In2 determines the temporal behavior of the drive signal, and here in one embodiment the amplitude thereof. The switching parameter information In2 can be transmitted in the form of a digital data word, which is illustrated schematically in FIG. 2.

In FIG. 2, t2 denotes an instant at which the switching parameter information In2 has been completely transmitted to the driver circuit 3. In this example, the driver circuit 3 is designed to maintain the previous level of the drive signal S3 until this instant t2 and to set the signal level of the drive signal S3 in accordance with the switching parameter information In2 at the instant t2 or after the instant t2. The signal level represented by the switching parameter information In2 for the switch-on operation is designated by L1 in FIG. 2. In the example illustrated, starting from the instant t2, the drive signal S3 has a positive sign, that is to say that a charging current flows onto the gate-source capacitance of the transistor M, whereby the gate-source voltage VGS thereof rises starting from the instant t2.

In FIG. 2, t5 denotes an instant at which the threshold voltage Vth of the transistor M has been reached, starting from which threshold voltage the transistor M begins to conduct. Owing to the known Miller effect, the drive voltage VGS, despite a flowing charging current, remains at the value of the threshold voltage Vth for a time duration and then rises further up to a maximum value. The maximum value is substantially determined by the properties of a current source (not illustrated) in the driver circuit 3 which provides the drive current or charging current S2. It should also be noted in this context that the timing diagram of the drive voltage VGS is merely illustrated schematically in FIG. 2.

In FIG. 2, t3 denotes an instant at which the switching signal S1 has switch-off information in the form of a falling edge of the switching signal. At this instant, switching information In1 is generated by the control circuit 1 and transmitted to the driver circuit 3. In the example illustrated, this switching information for a switch-off of the transistor M is a negative signal pulse of the information signal S1. After this switching information In1, switching parameter information In2 is transmitted which defines the amplitude of the drive signal S3 for the switch-off operation. This amplitude for the switch-off operation can differ from the amplitude for the switch-on operation, that is to say that the switching parameter information for the switch-off operation can differ from the switching parameter information for the switch-on operation. In the example illustrated, the control information is transmitted at the instant t4. Starting from this instant, the driver circuit 3 sets the drive signal S3 to the value desired for the switch-off operation. In the example illustrated, the drive signal S3 has a negative sign for the switch-off operation, that is to say that a discharging current flows from the gate-source capacitance, the amplitude of the current being determined by the switching parameter information In2 transmitted after the instant t3. The drive voltage VGS of the transistor M decreases after the instant t4 owing to the discharging current, then remains at the value of the threshold voltage Vth for a time duration owing to the Miller effect, and subsequently decreases further down to zero.

In the embodiment explained with reference to FIG. 2, a switching operation of the transistor M begins only after the switching parameter information In2 has been transmitted, that is to say—in the example illustrated—only at the end of the time duration Tc during which the items of control information are transmitted. In order to accelerate the switching operations, in a further example, the driver circuit 3 is designed to set, immediately after the presence of switching information, a first signal level of the drive signal S3, the sign of which takes account of the respective switching information, and only after reception of the switching parameter information In2 to set the level of the drive signal S3 to the amplitude represented by the switching parameter information In2. Associated temporal signal profiles are illustrated in FIG. 3.

Figure 3:
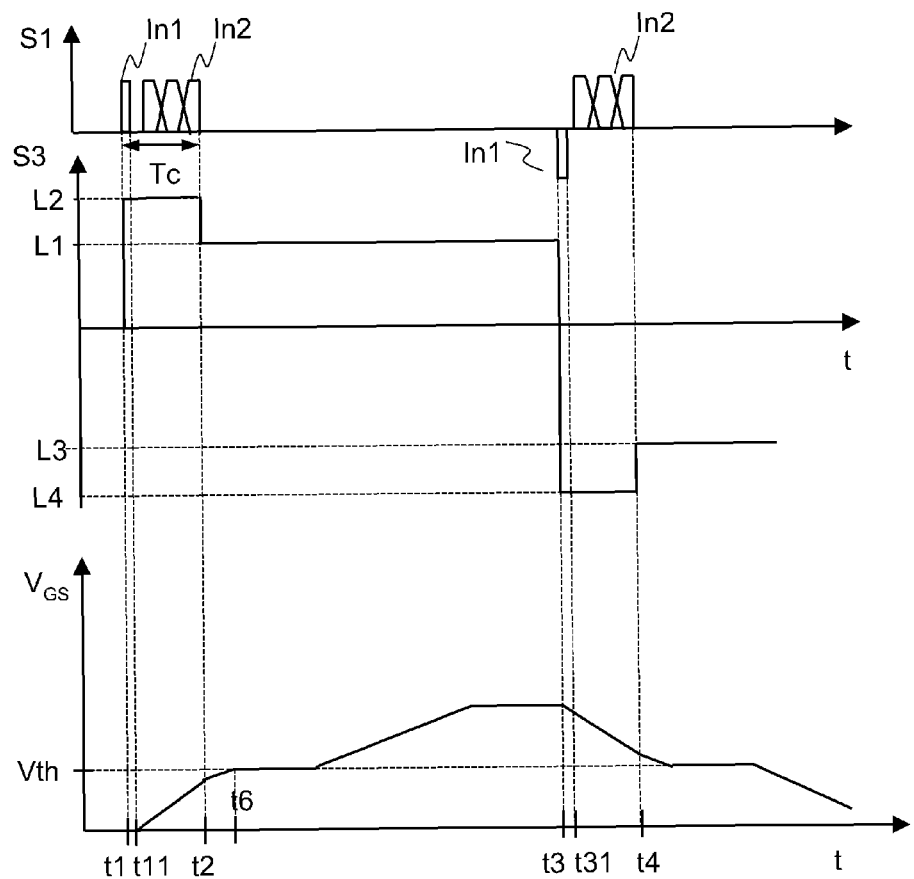
FIG. 3 illustrates the operating principle of a further embodiment of the circuit arrangement on the basis of signal timing diagrams.

In FIG. 3, t11 denotes an instant at which the switching information In1 is present in the driver circuit 3. Starting from this instant, the driver circuit 3 sets a first signal level L2 of the drive signal S3. The sign of this signal level takes account of the respective switching information. In the example illustrated, the drive signal S3 has a positive sign if the switching information is switch-on information, and a negative sign if the switching information is switch-off information. The second signal level L1 of the drive signal corresponds to the signal level L1 already explained above with reference to FIG. 2. The first signal level L2 can be greater or less than the second signal level L1. One example provides for the first signal level L2 to correspond to a maximum signal level which the drive signal S3 can assume for the respective switching operation, that is to say the switch-on operation or the switch-off operation. In this example, the drive voltage VGS of the transistor M changes as early as from the instant t11 at which the switching information is present. In the switch-on operation illustrated starting from the instant t1, the drive voltage VGS rises starting from the instant t11. The gate-source capacitance is hereby precharged before the switching parameter information is present at the instant t2 and the driver circuit 3 sets the signal level of the drive signal S3 to the second value as a result of the switching parameter information In2. The "precharging" of the gate-source capacitance has no direct effect on the switching edges of a load current switched by the transistor M or the voltages present across the transistor M or the load Z, as long as the gate-source voltage VGS does not reach the threshold value Vth during this time duration. The first signal level L2 and the time duration Tc during which the control information is transmitted should therefore be coordinated with one another such that the threshold voltage Vth of the transistor M is not reached before the switching parameter information has been transmitted to the driver circuit 3. In FIG. 3, t6 denotes an instant at which the threshold voltage Vth or the Miller plateau has been reached.

In the embodiment illustrated in FIG. 3, a turn-off operation of the transistor M functions in a manner corresponding to the switch-on operation. At an instant t31, the turn-off information is present in the driver circuit 3. The driver circuit 3 thereupon sets a first signal level L4 of the drive signal S3 for the turn-off operation before the switching parameter information is present at an instant t4 and the driver circuit 3 sets the signal level for the turn-off operation to a second level value L3, which is represented by the switching parameter information In2 for the turn-off operation.

Figure 4:
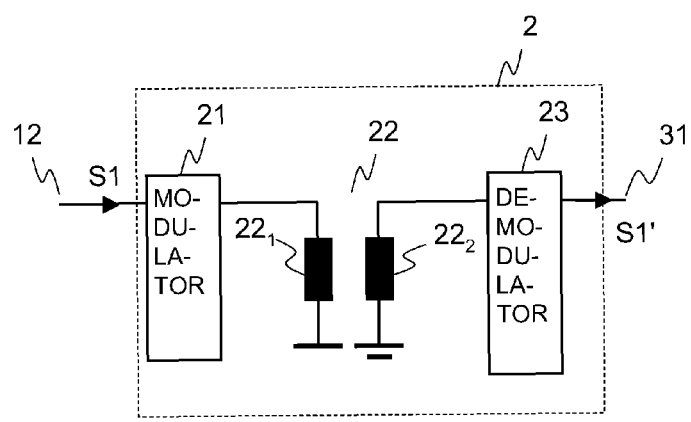
FIG. 4 illustrates one embodiment of a transmission channel.

The transmission channel 2 between the control circuit 1 and the driver circuit 3 can be any transmission channel suitable for signal transmission. The transmission channel 2 can contain—as already mentioned briefly—a potential barrier, in one embodiment. One example of a transmission channel 2 having such a potential barrier is illustrated in FIG. 4. In the example illustrated, the potential barrier of the transmission channel 2 is a transformer 22 having a primary winding 221 and a secondary winding 222, which is inductively coupled to the primary winding. The transformer 22 can be, in one embodiment, a transformer without a transformer core (coreless transformer) or air-core coil-type transformer. Such transformers can be part of an integrated circuit in which the control circuit 1 and the driver circuit 3 can be integrated. The transmission channel 2 additionally includes a modulator 21, into which the information signal S1 is fed from the control circuit 1 and which is connected to the primary winding 221. This modulator 21 is designed to convert the information signal S1 made available by the control circuit 1 to a signal suitable for transmission via the transformer 22. A demodulator 23 is correspondingly connected to the secondary winding 222, the demodulator being designed to convert the signals transmitted from the primary winding 221 to the secondary winding 222 into the information signal S1' fed to the driver circuit 3.

Transformers, in one embodiment coreless transformers, are able to transmit the items of control information In1, In2 at a speed required for the switching operation. If the control information is intended for example to be transmitted within a time duration of 100 ns and if the control information includes 5 bits, for example, then a transmission rate of 50 Mbauds is necessary, which can be ensured without any problems by using coreless transformers. A high transmission speed for the control information is necessary in one embodiment when—as in the example in accordance with FIG. 3—the switching operation of the transistor M is already initiated before the switching parameter information In2 is actually present. In this case, as already mentioned, it should be ensured that the switching parameter information is present in the driver circuit 3 before the transistor M actually reaches its threshold voltage Vth and begins to change its switching state.

Figure 5:
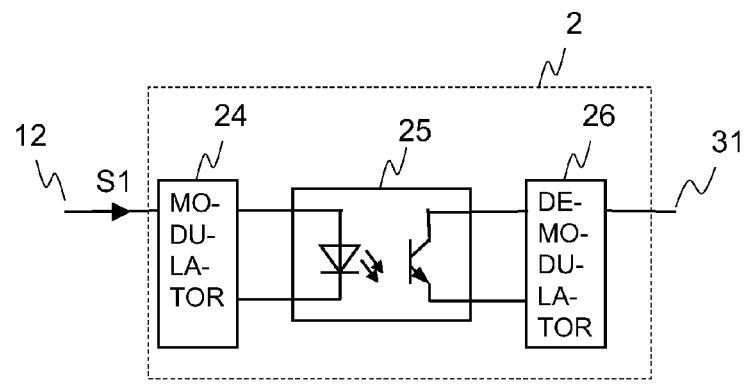
FIG. 5 illustrates another second embodiment of a transmission channel.

Referring to FIG. 5, instead of a transformer, it is also possible to provide an optocoupler 25 for potential isolation in the transmission channel 2. On the transmitter side, a modulator 24 is connected to the optocoupler 25 and converts the information signal S1 into signals suitable for transmission via the optocoupler 25. On the receiver side, a demodulator 26 is connected to the optocoupler 25 and is configured to convert signals transmitted via the optocoupler 25 into the information signal S1' fed to the driver circuit.

Figure 6:
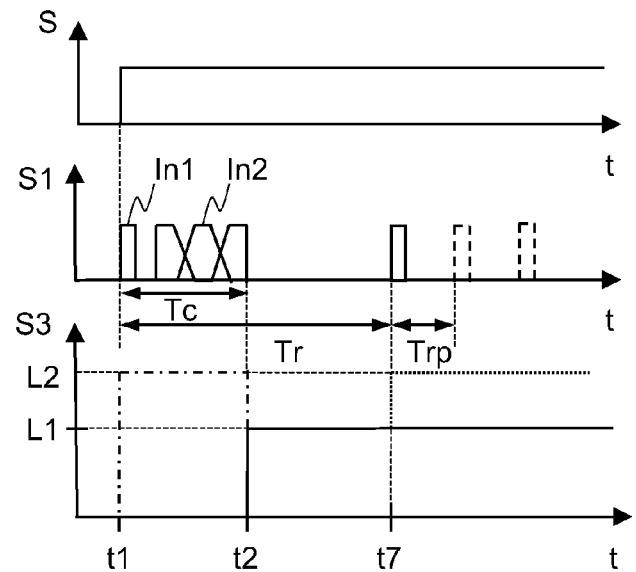
FIG. 6 illustrates an operating principle of a further embodiment of a circuit arrangement on the basis of signal timing diagrams.

FIG. 6 illustrates a further example of a circuit arrangement on the basis of temporal signal profiles. FIG. 6 illustrates the signal profiles for a switch-on operation of the transistor M. The switch-off operation functions correspondingly. In this example, the control circuit 1 is designed to refresh the switching information In1 first transmitted at the instant t1, that is to say to transmit it again at least once at a later instant, provided that no new switching information is present in the switching signal S in the meantime. In FIG. 6, Tr denotes the temporal separation between the first transmission of switching information In1 and a first renewed transmission of the switching information In1. As is illustrated by dashed lines in FIG. 6, the switching information In1 can be transmitted at regular time intervals Trp, but can also be transmitted anew at irregular time intervals, as long as no new switching information is present in the switching signal S, that is to say as long as—in relation to the example illustrated—the signal level of the switching signal S does not change.

The explanations given above hold true for the first transmission of the switching information In1 at the instant t2 and the transmission of the switching parameter information In2, and also the generation of the control signal S3 from these items of control information transmitted during the time duration Tc. The driver circuit 3 can therefore generate the control signal S3 in accordance with the explanations concerning FIG. 2, which is illustrated as a solid line in FIG. 6, or in accordance with the explanations concerning FIG. 3, which is illustrated by the solid and dash-dotted line in FIG. 6.

One embodiment provides for the control circuit to change, and in one embodiment increase the signal level of the drive signal S3 starting from an instant t7 at which the switching information In1 is transmitted anew for the first time. This is illustrated on the basis of a dotted line in FIG. 6. The driver circuit 3 can be configured in one embodiment to output the maximum signal level of the drive signal S3 for the respective switching operation starting from the instant t7. In this case, the temporal separation between the first transmission of the switching information and the first repeated transmission of the switching information should be large enough that, at the instant t7 at which the level of the drive signal changes, the switching operation is substantially concluded, such that the change in the signal level of the drive signal S3 no longer affects the switching speed or the gradient of the switching edges.

Figure 7:
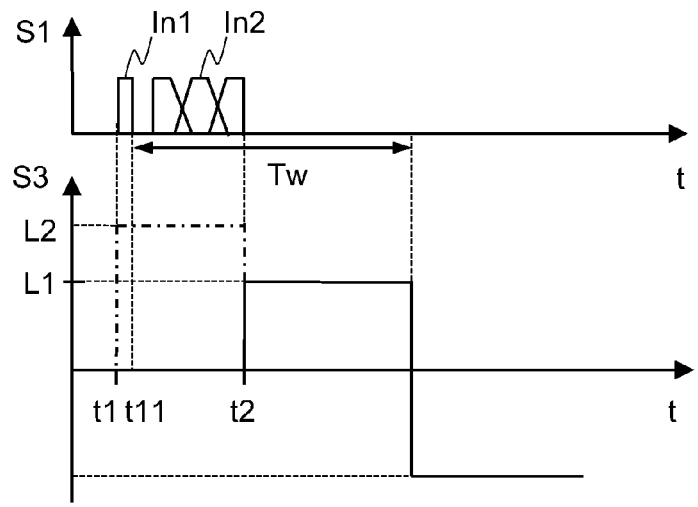
FIG. 7 illustrates, on the basis of signal timing diagrams, an operating principle of an embodiment of a circuit arrangement in the case of a fault.

FIG. 7 elucidates an operating principle of a further embodiment of the driver circuit 3 on the basis of temporal signal profiles. This driver circuit is designed to drive the transistor M in the off state if no renewed transmission of the switching information is determined after a waiting time Tw has elapsed after reception of the first switching information In1. In this case, a fault in the control circuit 1 or the transmission channel 2 is assumed, with the result that the transistor M is turned off for safety reasons. This is illustrated in FIG. 7 by the fact that after the waiting time Tw has elapsed, the drive signal S3 changes to a switch-off level, that is to say to a level at which the transistor M is driven in the off-state.

Figure 8:
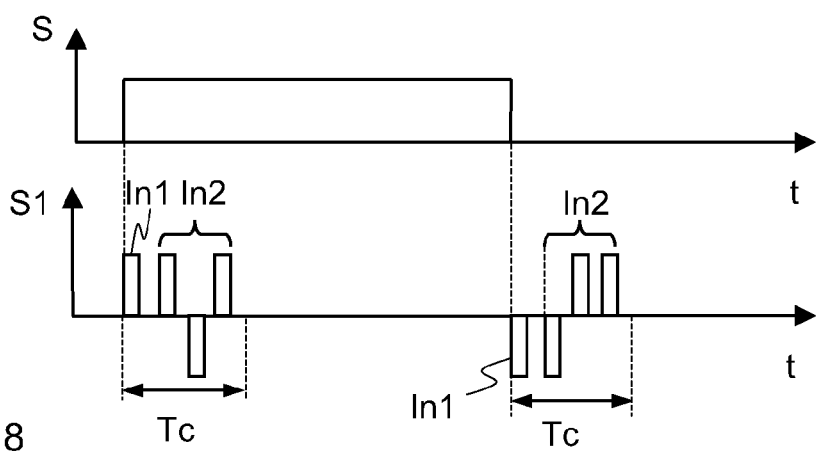
FIG. 8 illustrate one embodiment of information transmission from the control circuit to the driver circuit via the transmission channel.

The items of control information transmitted from the control circuit 1 to the driver circuit 3 via the channel 2 can be coded in a desired manner. Examples of possible transmission methods are explained below. Referring to FIG. 8, the items of control information can be transmitted as binary coded data via a single transmission channel, where positive signal pulses of the information signal S1 represent a first value, for example a logic "1", and negative signal pulses represent a second value, for example a logic "0", of the binary data to be transmitted.

Figure 9:
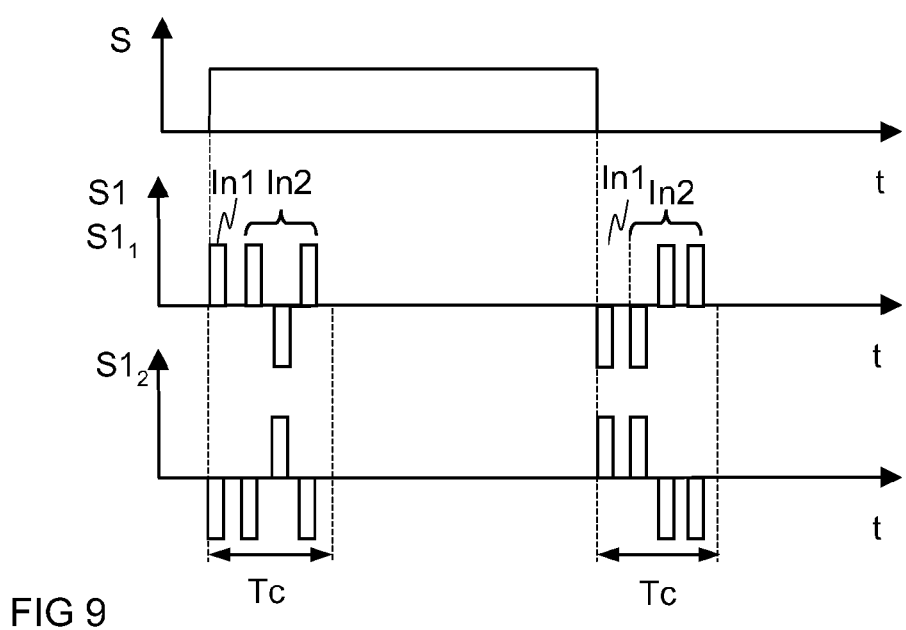
FIG. 9 illustrates another embodiment of information transmission.

In order to increase the transmission reliability, referring to FIG. 9, the binary data to be transmitted can in one option be transmitted in differentially coded fashion. In this case, there are two transmission channels present between the control circuit 1 and the driver circuit 3, via which respectively complementary signal pulses are transmitted. In this case, the driver circuit 3 can be designed to accept only complementary pulses on the two channels as information pulses. Interference pulses which would have an effect as common-mode pulses on both channels therefore cannot incorrectly lead to a change in the switching state of the transistor M. In FIG. 9, S1 denotes the information signal and S11, S12 denote the first and second information signals transmitted by the two channels, one of which, S11, corresponds to the information signal S1 in the example.

Figure 10:
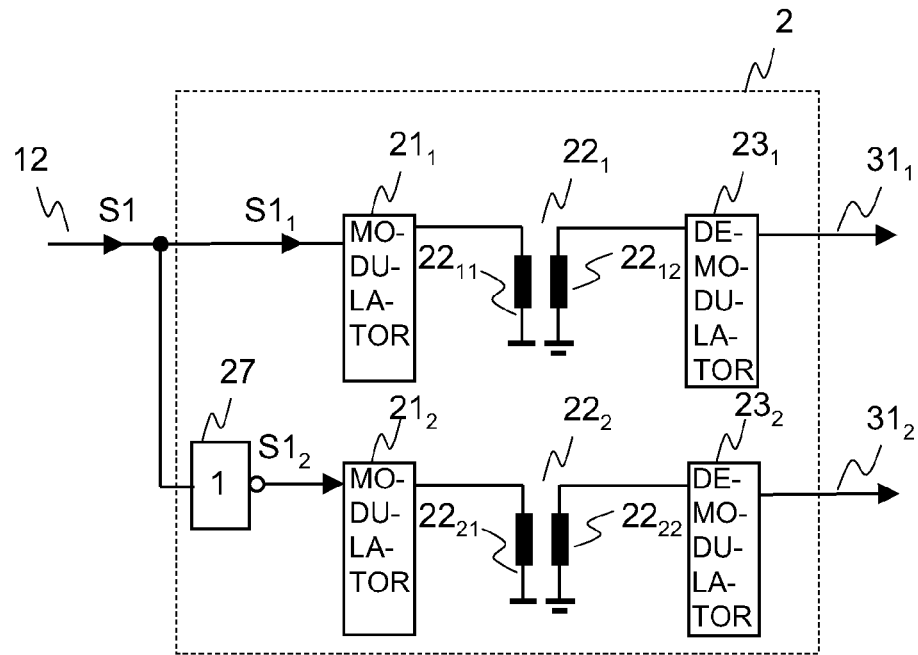
FIG. 10 illustrates one embodiment of a transmission channel for the information transmission in accordance with FIG. 9.

One embodiment of a transmission channel for the transmission explained with reference to FIG. 9 is illustrated in FIG. 10. In the embodiment illustrated, this transmission channel includes two transformers 221, 222 having respectively a primary winding 2211, 2221 and a secondary winding 2212, 2222. On the transmitter side a modulator 211, 212 and on the receiver side a demodulator 231, 232 are connected to each of the transformers 221, 222. The information signal S1 is fed to a first 211 of the modulators directly and to a second 212 of the modulators in a manner inverted by using an inverter 27, such that respectively complementary information signals are transmitted via the two channels for the transformers 221, 222. Two complementary information signals S11' and S12' are correspondingly available at the output of this transmission channel 2, the information signals being processed further by the driver circuit 3 in the manner explained.

Figure 11:
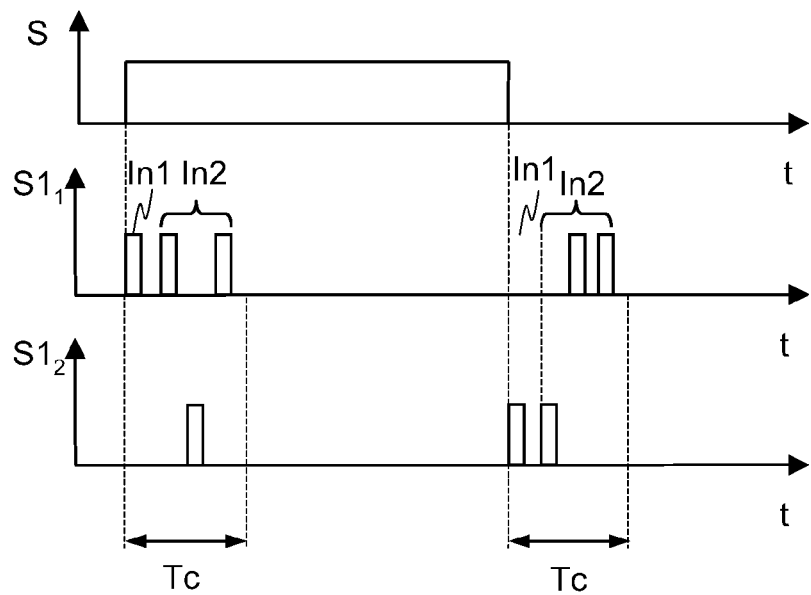
FIG. 11 illustrates another embodiment of information transmission from the control circuit to the driver circuit.

The previously explained methods require modulators that are able to transmit both positive and negative signal pulses via the respective channel. In a further transmission method, illustrated in FIG. 11, there are two transmission channels present, via which respectively one information signal S11, S12 is transmitted. In this case, one of these channels serves for transmitting the bits with the logic 1 and the other of the channels serves for transmitting the bits with logic 0 of the control information. In this case, only positive signal pulses can be transmitted via each of these channels.

Figure 12:
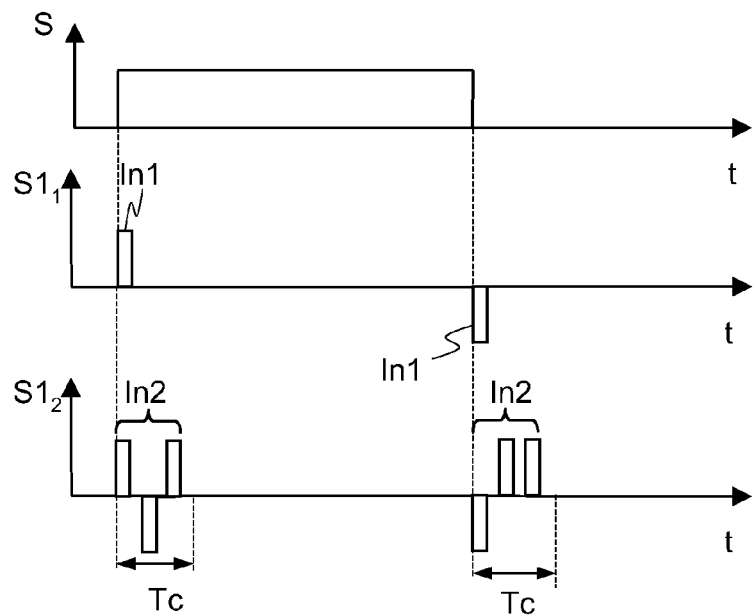
FIG. 12 illustrates another embodiment of information transmission from the control circuit to the driver circuit.

Referring to FIG. 12, a further embodiment provides for the switching information In1 and switching parameter information In2 to be transmitted temporally in parallel via two parallel transmission channels. A first information signal S11 transmitted from the control circuit 1 to the driver circuit 3 contains the switching information in this case, and a second information signal S12 transmitted from the control circuit 1 to the driver circuit 3 contains the switching parameter information In2 in this case.

Figure 13:
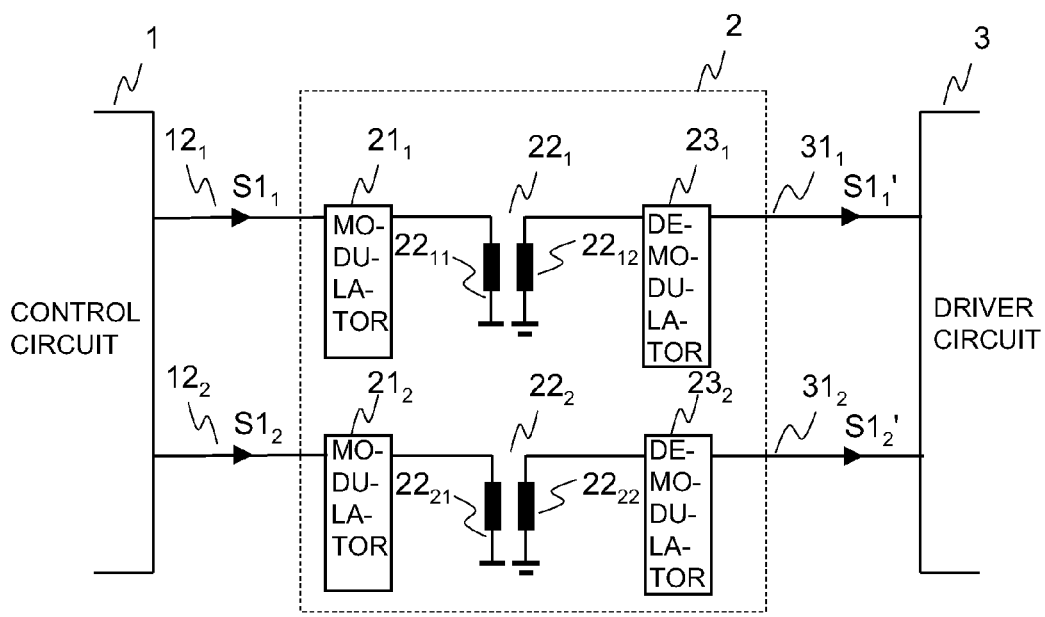
FIG. 13 illustrates another embodiment of a transmission channel for the information transmission in accordance with FIG. 12.

FIG. 13 illustrates one embodiment of a transmission channel 2 for such a transmission of the items of control information. In a manner corresponding to the transmission channel explained with reference to FIG. 10, this transmission channel 2 includes two transformers 221, 222, two modulators 211, 212 and two demodulators 231, 232. In this example, the control circuit 1 generates two information signals S11, S12 at two outputs 121, 122, of which the first information signal contains the switching information and the second information signal contains the switching parameter information. Two information signals S11', S12' are correspondingly available at the output of the channel 2, the information signals being fed to two inputs 311, 312 of the driver circuit 3.

The driver circuit 3 can be designed to directly implement the switching parameter information In2 received via the transmission channel 2, that is to say to readily implement the information received. This means that, depending on the switching parameter information In2, any arbitrary changes in the switching parameters are possible from switching operation to switching operation. In a further embodiment, the driver circuit 3 is configured not to permit any arbitrary changes in the switching parameters from switching operation to switching operation, but rather to limit these changes. It is based on the consideration that great changes from switching operation to switching operation in the switching parameters received by the driver circuit 3 can be caused by errors during transmission. The driver circuit can be designed for example to limit a change in the drive current S3 from switching operation to switching operation to a predefined maximum value. If this maximum permissible change is $\Delta S3max$, for example, and if this maximum permissible change is smaller than a difference between a minimum possible drive current S3min and a maximum possible drive current S3max, then a plurality of switching operations are necessary until the drive current S3 can rise to the maximum value S3max proceeding from the minimum value S3min and vice versa.

Figure 14:
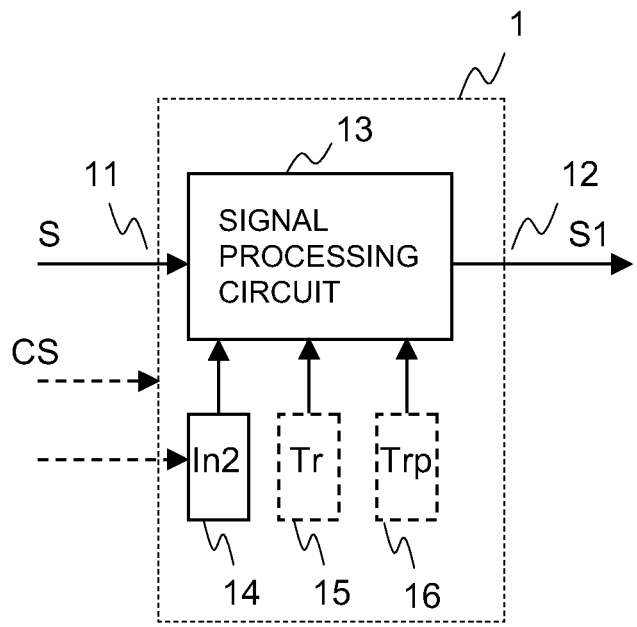
FIG. 14 illustrates one embodiment of the control circuit on the basis of a block diagram.
Figure 15:
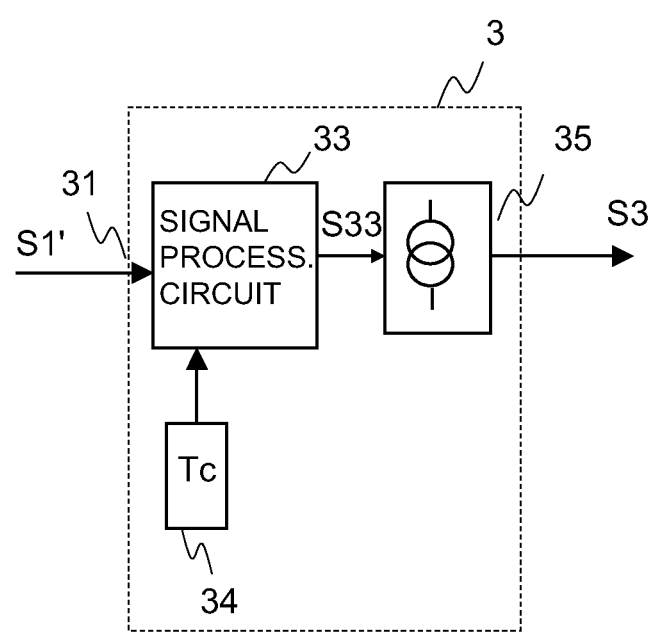
FIG. 15 illustrates one embodiment of the driver circuit on the basis of a block diagram.

FIGS. 14 and 15 illustrate block diagrams of embodiments of the control circuit 1 and the driver circuit 3. In the example, the control circuit 1 has a signal processing circuit 13, to which the switching signal S is fed and which generates the at least one information signal S1 from the switching signal S. The switching parameter information In2 is stored in a memory 14, such as a register 14, for example, which is connected to the signal processing circuit 13. The memory can be given fixed programming ready from the manufacturer. However, the memory content can also be given fixed programming by a user, or in one embodiment altered during operation, which is illustrated by dashed lines in FIG. 14. By using the content of this memory there is the possibility in one embodiment, of adaptively setting the switching speed over a plurality of switching operations of the transistor M. Adaptive methods for setting the switching speed of a transistor are known, in principle, and so further explanations in this respect can be dispensed with.

The control circuit 1 can include further memories 15, 16, in which is stored for example the time duration Tr starting from which the switching information is intended to be transmitted anew for the first time, or in which is stored a period duration Trp with which the switching information is intended to be periodically repeated. The control circuit 1 can be realized as a microcontroller, in one embodiment.

Referring to FIG. 15, the driver circuit 3 has a signal processing circuit 33, to which the at least one information signal S1' is fed. A control signal S33 is available at the output of the signal processing circuit 33 and drives a current source arrangement 35, which provides the control signal S3. In this case, the current control signal S33 determines both the current direction and the amplitude of the current S3 provided by the current source arrangement 35. The driver circuit 3 can contain a memory 34, in which is stored information about the transmission time Tc within which the items of control information are transmitted. The signal processing circuit 33 can use this information to determine, after reception of a first signal pulse from the control circuit 1, the end of the transmission duration of the items of control information and to set the sign and amplitude of the drive signal S3 depending on the end of the transmission duration.

With regard to the memories explained in connection with FIGS. 14 and 15 it should additionally be mentioned that these memories can also be realized as memories whose memory content is predefined by external circuitry, e.g., with resistors. In this case, however, the memory content can only be altered by changing the circuitry.

Figure 16:
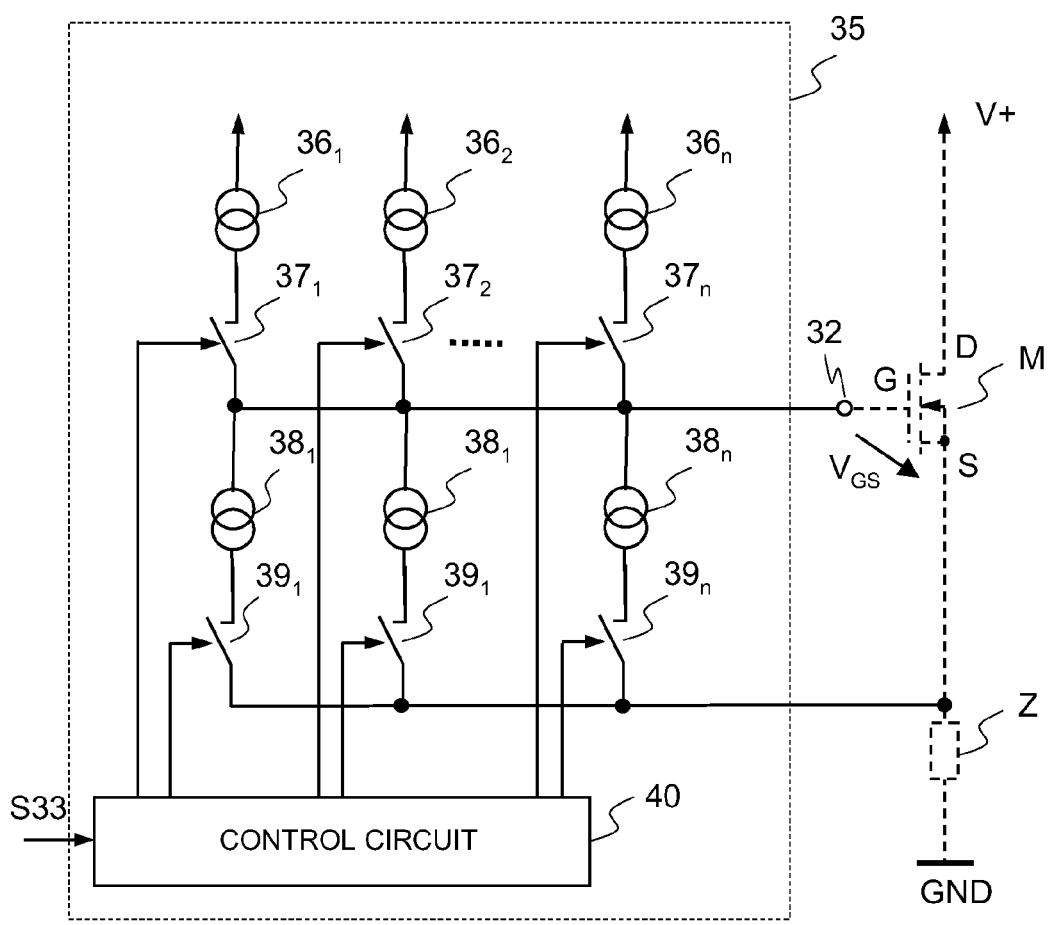
FIG. 16 illustrates one embodiment of a current source circuit of the driver circuit.

FIG. 16 illustrates an embodiment of a current source arrangement 35 of the driver circuit 3. This current source arrangement 35 has a number of current sources 361, 362, 36*n*, 381, 382, 38*n*, a first group 361, 362, 36*n* of which are connected in parallel with one another and between a terminal for a first supply potential and the output 32 and a second group 381, 382, 38*n* of which are connected in parallel with one another and between a terminal for a second supply potential, in the embodiment the source potential of the transistor M, and the output 32. These current sources can be activated or deactivated individually by a control circuit 40, to which the current control signal S33 is fed. For activating or deactivating the individual current sources, in the embodiment illustrated, switches 371, 372, 37*n*, 391, 392, 39*n* are provided, one of which respectively is connected in series with one of the current sources and which are driven by the control circuit 40. The current sources are activated or deactivated in a manner dependent on the control signal S33 with the aim of setting the current direction of the drive current S3 and the amplitude thereof. One or more current sources 361, 362, 36*n* of the first group are driven for driving the transistor M in the on state and one or more current sources 381, 382, 38*n* of the second group are driven for driving the transistor M in the off-state. The currents supplied by the individual current sources can each be identical, but they can also be different.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement comprising:
a transistor configured to receive a drive signal;
a control circuit configured to receive a switching signal;
a driver circuit configured to generate the drive signal for the transistor; and
at least one transmission channel arranged between the control circuit and the driver circuit,
wherein the control circuit is configured to transmit, depending on the switching signal and for each switching operation of the transistor, both switching information and switching parameter information via the transmission channel to the driver circuit, the switching parameter information including switching speed information,
wherein the driver circuit is configured to generate, depending on both the switching information and the switching parameter information, the drive signal, wherein the driver circuit is further configured to generate the drive signal at a voltage or current level that is dependent on the switching speed information, and
wherein the control circuit is further configured to transmit the switching information via the transmission channel to the driver circuit anew at least once after a waiting time has elapsed after transmission of the switching parameter information.

2. The circuit arrangement of claim 1, wherein the driver circuit is further configured to generate the drive signal at a fist voltage or current level prior to a renewed reception of the switching information, wherein the driver circuit is further configured to generate the drive signal at a second voltage or current level after the renewed reception of the switching information.

3. The circuit arrangement of claim 2, wherein the second voltage or current level corresponds to the first voltage or current level.

4. The circuit arrangement of claim 1, wherein the switching information is transmitted as binary code.

5. The circuit arrangement of claim 1, wherein the switching information include a positive pulse or a negative pulse.

6. The circuit arrangement of claim 1, wherein the switching parameter information is transmitted as binary code.

7. The circuit arrangement of claim 1, wherein the switching parameter information includes a positive pulse or a negative pulse.

8. The circuit arrangement of claim 1, wherein the control circuit is configured to transmit the switching information anew at least once during each switching operation of the transistor after a waiting time has elapsed after transmission of the switching parameter information.

9. The circuit arrangement of claim 1, wherein the switching parameter information comprises at least one of:
signal level information indicating a maximum voltage or current level of the drive signal, or
delay information which defines a waiting time between the presence of the switching information and the beginning of a switching operation.

10. The circuit of claim 1, wherein the transistor is configured to change switching states at a switching speed that is based on the voltage or current level of the drive signal.

11. The circuit of claim 1, wherein the transistor is configured to provide a load current that has a switching edge based on the voltage or current level of the drive signal and dependent on the switching speed information.

12. A circuit arrangement comprising:
a transistor configured to receive a drive signal;
a control circuit configured to receive a switching signal;
a driver circuit configured to generate the drive signal for the transistor; and
at least one transmission channel arranged between the control circuit and the driver circuit;

wherein the control circuit is configured to transmit, depending on the switching signal for each switching operation of the transistor, both switching information and switching parameter information via the transmission channel to the driver circuit, the switching parameter information including switching speed information, wherein the driver circuit is configured to generate, depending on both the switching information and the switching parameter information, the drive signal, wherein the driver circuit is further configured to generate the drive signal at a voltage or current level that is dependent on the switching speed information, and wherein the switching information is provided anew after a waiting time has elapsed after provision of the switching parameter information.

13. The circuit arrangement of claim 12, wherein the driver circuit is configured to generate the drive signal at a first voltage or current level prior to a renewed reception of the switching information, wherein the drive circuit is configured to generate the drive signal at a second voltage or current level after the renewed provision of the switching information.

14. The circuit arrangement of claim 13, wherein the second voltage or current level corresponds to the first voltage or current level.

15. The circuit arrangement of claim 12, wherein the switching parameter information comprises at least one of:
    signal level information indicating a maximum voltage or current level of the drive signal, or
    delay information which defines a waiting time between the presence of the switching information and the beginning of a switching operation.

16. The circuit of claim 12, wherein the transistor is configured to transition from an off-state to an on-state or from the on-state to the off-state at a rate that is indicated by the switching speed information.

17. The circuit of claim 12, wherein the switching speed information indicates a speed at which the transistor is to change switching states.

18. A circuit arrangement comprising:
    a transistor configured to receive a drive signal;
    a control circuit configured to receive a switching signal;
    a driver circuit configured to generate the drive signal for the transistor; and
    at least one transmission channel arranged between the control circuit and the driver circuit;
    wherein the control circuit is configured to transmit, depending on the switching signal and for each switching operation of the transistor, switching information and switching parameter information via the transmission channel to the driver circuit, the switching parameter information including switching speed information,
    wherein the driver circuit is configured to generate, depending on both the switching information and the switching parameter information, the drive signal, wherein the driver circuit is further configured to generate the drive signal at a voltage or current level that is dependent on the switching information, and
    wherein the driver circuit is configured to drive the transistor to the off-state by generating the drive signal if no renewed transmission of the switching information is determined after a waiting time has elapsed after reception of the switching information.

19. The circuit arrangement of claim 18, wherein the switching parameter information comprises at least one of:
    signal level information indicating a maximum voltage or current level of the drive signal, or
    delay information which defines a waiting time between the presence of the switching information and the beginning of a switching operation.

20. The circuit of claim 18, wherein the transistor is configured to provide a load current having a rate of change that is dependent on the switching speed information.

21. The circuit of claim 18, wherein the switching speed information indicates an amount of time for the transistor to transition from a switch-off operation to a switch-on operation or to transition from the switch-on operation to the switch-off operation.

* * * * *